(12) United States Patent
Hamman

(10) Patent No.: US 7,400,502 B2
(45) Date of Patent: Jul. 15, 2008

(54) CONNECTOR HEAT TRANSFER UNIT

(75) Inventor: Brian A. Hamman, Krugerville, TX (US)

(73) Assignee: QNX Cooling Systems Inc., Krugerville, TX (US)

( * ) Notice: Subject to any disclaimer, the term of this patent is extended or adjusted under 35 U.S.C. 154(b) by 77 days.

(21) Appl. No.: 11/319,942

(22) Filed: Dec. 29, 2005

(65) Prior Publication Data

US 2007/0153479 A1 Jul. 5, 2007

(51) Int. Cl.
*H05K 7/20* (2006.01)

(52) U.S. Cl. ............... 361/699; 361/719; 165/80.3; 165/80.4; 257/714

(58) Field of Classification Search .............. None
See application file for complete search history.

(56) References Cited

U.S. PATENT DOCUMENTS

| | | | | |
|---|---|---|---|---|
| 4,323,914 | A * | 4/1982 | Berndlmaier et al. | 257/713 |
| 5,050,036 | A * | 9/1991 | Oudick et al. | 361/699 |
| 5,130,889 | A * | 7/1992 | Hamburgen et al. | 361/707 |
| 5,146,314 | A * | 9/1992 | Pankove | 257/712 |
| 5,270,572 | A * | 12/1993 | Nakajima et al. | 257/714 |
| 6,771,500 | B1 * | 8/2004 | Siegel et al. | 361/699 |
| 6,889,509 | B1 * | 5/2005 | Cader et al. | 62/118 |
| 6,992,888 | B1 * | 1/2006 | Iyer | 361/699 |
| 7,035,104 | B2 * | 4/2006 | Meyer | 361/700 |
| 7,044,768 | B1 * | 5/2006 | Tilton et al. | 439/485 |
| 7,133,286 | B2 * | 11/2006 | Schmidt et al. | 361/718 |
| 7,149,086 | B2 * | 12/2006 | Faneuf et al. | 361/699 |
| 7,174,738 | B2 * | 2/2007 | Scott | 62/259.2 |

FOREIGN PATENT DOCUMENTS

| | | | | |
|---|---|---|---|---|
| JP | 60037756 | A * | 2/1985 | |
| JP | 04152659 | A * | 5/1992 | |
| JP | 2003163316 | A * | 6/2003 | |

\* cited by examiner

*Primary Examiner*—Boris Chérvinsky
(74) *Attorney, Agent, or Firm*—Patent Dominion LP

(57) ABSTRACT

A connector heat transfer unit is presented. A number of embodiments are presented. Each embodiment includes a housing capable electrically connecting one or more heat generating components to an electronic system and cooling the heat generating components.

20 Claims, 7 Drawing Sheets

CONNECTOR HEAT TRANSFER UNIT

BACKGROUND OF THE INVENTION

1. Cross Reference to Related Applications:

Reference is made to pending U.S. patent application Ser. No. 10/688,587 filed Oct. 18, 2003 for a detailed description of a cooling systems and various heat transfer units and heat exchangers and their operation.

2. Description of the Related Art:

At the heart of data processing and telecommunication devices are processors and other heat-generating components which are becoming increasingly more powerful and generating increasing amounts of heat. As a result, more powerful cooling systems are required to prevent these components from thermal overload and resulting system malfunctions or slowdowns.

Traditional cooling approaches such as heat sinks and heat pipes are unable to practically keep up with this growing heat problem. Cooling systems which use a liquid or gas to cool these heat generating components are becoming increasingly more needed and viable. These systems utilize heat transfer units thermally coupled to the heat generating components for absorbing or extracting heat from the heat generating components into a coolant flowing there through. The coolant, now heated, is directed to a heat exchanger where heat is dissipated from the coolant, creating cooled coolant and returned to the heat transfer unit to repeat the cycle.

Liquid cooling for these heat generating components is a much viable approach to this heat problem. A typical liquid cooling system employs one or more heat transfer units thermally coupled to the heat generating components for absorbing heat from the components into the liquid coolant and a heat exchanger which dissipates heat from the coolant and returns cooled liquid to the heat transfer units.

The heat transfer unit is typically comprised of a housing with a cavity there through for the coolant to flow through. The contact surface (with the heat generating components) is preferably thin and has excellent thermal transfer capability, such as copper.

Many of the heat generating components of today and high powered microprocessors, in particular, are connected into the electronic system in which they will be used by means of connector. The connector is often wave-soldered into a motherboard and has receptacles for receiving the pins of the component and allows for easy insertion and extraction into and out of the motherboard. The component then is not subjected to of any mishaps that may incur during wave-soldering or whatever insertion method is used.

For today's powerful microprocessors, for example, a bulky, heavy heat sink or heat pipe dissipater must then be coupled to component and the motherboard for fastening and often causes problems such as breakage of the mother board from the substantial torques that must be generated to secure the entire assembly and even shipping damage from the heavy weight of the air cooled cooling devices.

Thus, there is a need in the art for a method and apparatus for both securing the component to the system or motherboard and to provide efficient and powerful cooling of the component at the same time.

SUMMARY OF THE INVENTION

A method and apparatus for cooling heat generating components in an electronic system having a connector heat transfer unit with a housing coupled to one or more heat generating components with at least one first cavity for a coolant to flow there through and absorb heat from the components, means for connecting the electrical conductors of the heat generating components the electronic system, an inlet for receiving cooled coolant and directing the coolant to the cavity, and an outlet for receiving heated coolant from the cavity and directing it out of the connector heat transfer unit.

A method and apparatus for cooling heat generating components in an electronic system as described above and having one or more second cavities thermally coupled to a surface of the heat generating components for a coolant to flow there through and absorb heat from the heat generating components.

The cooling system as described above wherein the housing is comprised of thermally conductive material for transferring heat from electrical conductors of one or more heat-generating components to the first cavities.

The cooling system as described above wherein the first cavities are thermally coupled to a surface of one or more heat-generating components.

The cooling system as described above wherein the inlet for cooled coolant to the connector heat transfer unit is positioned below the outlet for heated coolant from the connector heat transfer unit for enhancing convective circulation of the coolant.

The cooling system described above having a heat exchange unit for receiving heated coolant from the connector heat transfer units, dissipating heat from the coolant creating cooled coolant and directing the cooled coolant to the connector heat transfer units.

The cooling system as described above set wherein one or more cavities have an open or partially open surface, such surface being thermally coupled to surfaces of one or more heat generating components and creating the cavities, whereby the coolant directly contacts the surfaces of one or more heat-generating components.

The cooling system as described above wherein one or more second cavities have an open or partially open surface, such surface being thermally coupled to surfaces of one or more heat-generating components and creating the second cavities, whereby the coolant directly contacts the surfaces of one or more heat-generating components.

A motherboard having a connector heat transfer unit.

An optical device having a connector heat transfer unit.

A system having one or more processors and having a connector heat transfer unit.

A heat generating component having one or more thermal spreaders for spreading heat from hot spots of the component wherein the heat spreader is thermally coupled to the bottom surface of the component or the surface of the component closest to the point of connection of the component to the system or motherboard.

A method of cooling one or more heat generating components utilizing a coolant to absorb heat from a first surface of the one or more heat generating components and a coolant to absorb heat from a second surface of the one or more heat generating components and wherein the first surfaces of the heat generating components are cooled in series and wherein the second surfaces of the heat generating components are cooled in series but in a different order than the first surfaces.

BRIEF DESCRIPTION OF THE DRAWINGS

FIG. 2C is a side, cross-sectional view of a housing including both a connector heat transfer unit and a cover heat transfer unit with a heat generating component disposed there in.

DETAILED DESCRIPTION

While the making and using of various embodiments of the present invention are discussed in detail below, it should be appreciated that the present invention provides many applicable inventive concepts, which can be embodied in a wide variety of specific contexts. The specific embodiments discussed herein are merely illustrative of specific ways to make and use the invention and do not limit the scope of the invention.

It should be understood that the principles and applications disclosed herein can be applied in a wide range of data processing systems, telecommunication systems and other systems. In the present invention, heat produced by a heat generating component such as a microprocessor in a data processing system is transfer to a coolant in a heat transfer unit and dissipated in the cooling system. Liquid cooling solves performance and reliability problems associated with heating of various heat generating components in electronic systems.

The present invention may be utilized in a number of computing, communications, and personal convenience applications. For example, the present invention could be implemented in a variety of servers, workstations, exchanges, networks, controllers, digital switches, routers, personal computers which are portable or stationary, cell phones, and personal digital assistants (PDAs) and many others.

The present invention is equally applicable to a number of heat-generating components (e.g., central processing units, optical devices, data storage devices, digital signal processors or any component that generates significant heat in operation) within such systems. Furthermore, the dissipation of heat in this cooling system may be accomplished in any number of ways by a heat exchange unit of various designs, but which are not discussed in detail in this application. The present invention may even be combined with a heat exchanger as part of a single unit to constitute the entire cooling system.

Figure 1B:
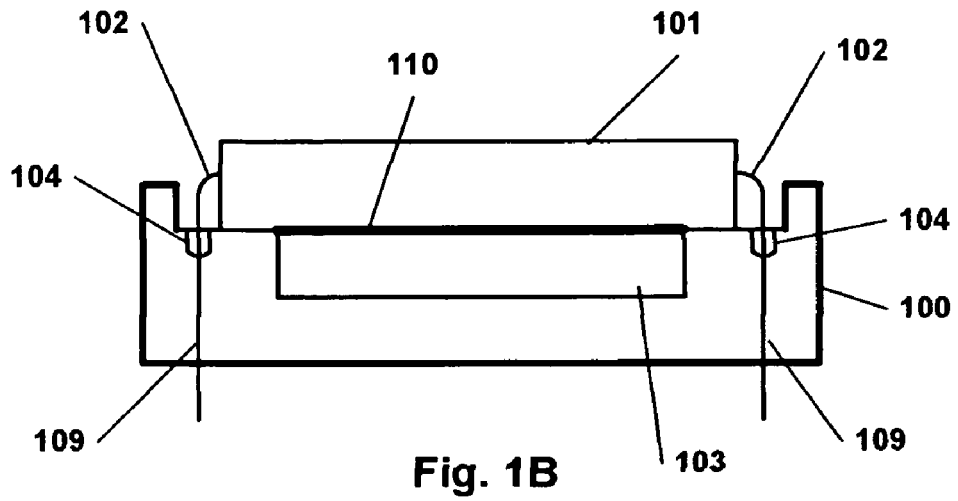
FIG. 1B is a side cross-sectional view of the connector heat transfer unit with a heat generating component disposed therein.
Figure 1A:
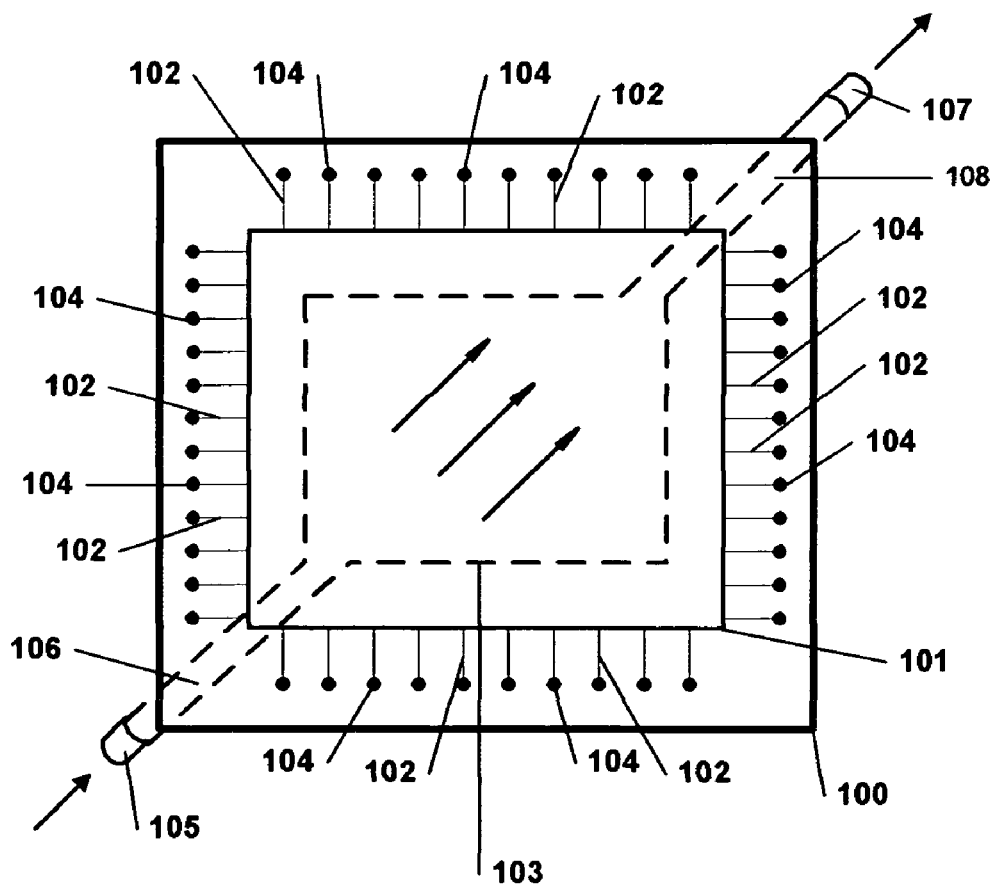
FIG. 1A is a top, cross-sectional view of the connector heat transfer unit with a heat generating component disposed therein.

Referring now to FIGS. 1A and 1B, a housing comprising a connector heat transfer unit 100 embodying the present invention is depicted. In FIG. 1A, a top cross-sectional view of the connector heat transfer unit is depicted with a heat generating component 101 inserted into the connector heat transfer unit 100. The heat generating component 101 depicted is a microprocessor. The connector heat transfer unit 100 may be of a variety of shapes and sizes, but these will be determined principally by the size and electrical conductor configuration of the heat generating component and the motherboard to which the connector heat transfer unit will be coupled. All of the following embodiments of the invention can be deployed in an application where the connector heat transfer unit is not mechanically attached to any type of motherboard and, it will be understood, that the present invention pertains to all methods for electrically connecting the connector heat transfer unit to the electronic system. The connector heat transfer unit may be composed of any number of materials but a lightweight, electrical insulating material is desirable.

In FIG. 1A, the electrical conductors 102 of the heat generating component 101 inserted into receptacles 104. A cavity 103 is disposed in the connector heat transfer unit 100 such that a surface of the cavity in thermally coupled to the surface of heat generating component 101. This surface of the cavity may be composed of any good heat conducting material, such as copper, to transfer heat from the heat generating component to a coolant flowing through the cavity.

An inlet 105 is coupled to an inlet pathway 106. An outlet pathway 108 is coupled to an outlet 107. In operation, cooled coolant received from a heat exchange unit is applied to inlet 105. It flows through the inlet pathway 106 and then into the cavity 103. Heat from the heat generating component 101 is absorbed into the coolant and heats the coolant. The heated coolant then flows through outlet pathway 108 to the outlet 107 and is then directed back to the heat exchange unit for cooling. It will be appreciated and understood that other methods of receiving the coolant, directing the coolant through and out of the connector heat transfer unit may be utilized and are within the purview of the present invention.

FIG. 1B is a side, cross-sectional view of the connector heat transfer unit 100 with the heat generating component 101 inserted therein. Electrical conductors or pins 102 from the heat generating component 101 are inserted into the receptacles 104. The connector heat transfer unit pins 109 electrically connect the receptacles 104 to the electronic system circuitry. For example, these pins 109 would be wave soldered to a motherboard, not shown. It will be appreciated that any number of ways may be used to connect the pins of heat generating component 101 to a motherboard or otherwise to the electronic system and the present invention is not limited to the receptacles 104 and pins 109 described above. For example, the connector heat transfer unit 100 may have a plurality of holes for pins 102 to be inserted into and through and then soldered to a motherboard or otherwise electrically connected to the electronic system.

In FIG. 1B, a side open view of the cavity 103 is depicted. The surface of the cavity 103, thermally coupled to the heat generating component 101, is depicted as 110. The surface 110 may be comprised of any good heat conducting material, such as copper. This surface 110 is preferably coupled to the heat generating component 101 by means of a thermal paste having good thermal transfer characteristics. Alternatively, the heat generating component 101 may be held in place within the connector heat transfer unit 100 and thermal coupling of the component 101 to the surface 110 achieved by use of one or more clips, not shown, from the connector heat transfer unit 100 to the component 101 or by a one or more clamp assemblies, not shown. In any case, it is preferable to apply thermal paste to the coupling of surface 110 with the component to insure maximum heat transfer. It should also be appreciated that the present invention encompasses many other possibilities for thermally coupling the component 101 to the surface 110 including, but not limited to, application of mechanical force, such as a clamping motion, to create a positive force between the component 101 and the surface 110 and thus improve thermal conductivity.

The electrical conductors or pins 102 of most commercial heat generating components 101, such as microprocessors, for example, are typically copper coated with precious metals. Thus, in addition to being good electrical conductors, they are also good heat conductors. Similarly, the receptacles 104 and electrical conductors or pins 109 may be comprised of similar materials with both good electrical and heat transfer characteristics. The connector heat transfer unit 100 may then be comprised of a material with good electrical insulation characteristics and good heat transfer characteristics to provide cooling and/or additional cooling of the heat-generating component 101. A wide variety of materials, such as a hard silicone, for example, can be used for this purpose in the connector heat transfer unit 100. Specifically, heat from the heat generating component 101 is transferred to the electrical conductors or pins 102. Some of this heat may be transferred from the pins 102, directly and/or indirectly through the receptacles 104 and pins 109, for example, to the connector heat transfer unit 100 and then on to the cavity 103 where the coolant flowing there through will absorb some or all of this heat for dissipation. A thermal paste can be applied to the electrical conductors or pins 102 to insure maximum heat transfer to the body of the connector heat transfer unit 100 directly, or indirectly through the receptacles 104 and pins 109, for example. It should also be appreciated that the present invention encompasses other possibilities for thermally coupling pins 102 to connector heat transfer unit 100 including, but not limited to, application of mechanical force to create pressure in a clamping motion.

Referring to FIG. 1B, it will be further appreciated that additional cooling mechanisms, such as air-cooled heat sinks or heat pipes for example (not shown), can be coupled to a free surface of the heat generating component 101 to provide for additional cooling, if desired.

In yet another alternative for coupling the surface 110 to the heat generating component 101, the surface 110 may be open or partially open allowing the coolant to come into direct contact with the heat generating unit and thereby eliminating the thermal resistance of both the surface 110 and the thermal paste or other thermal connection medium used. In this situation, for example, the surface 110 could be in the form of a flange around the perimeter of the cavity 103. When the flange is coupled and sealed to the heat generating component 101, the cavity is sealed and coolant will come in direct contact with the component 101 without leaks or spills.

Whenever possible, it is desirable to orient the connector heat transfer unit 100 so that the inlet 105 is situated below the outlet 107. This orientation allows the cooling system to take advantage of convective circulation of the coolant since heated coolant will naturally rise and cooled coolant will naturally drop. In this manner, the thermodynamics of the coolant can assist forced circulation, by a pump for example, and provide additional cooling of the heat generating components even after power is shut down to the electronic system through convective circulation.

Figure 2B:
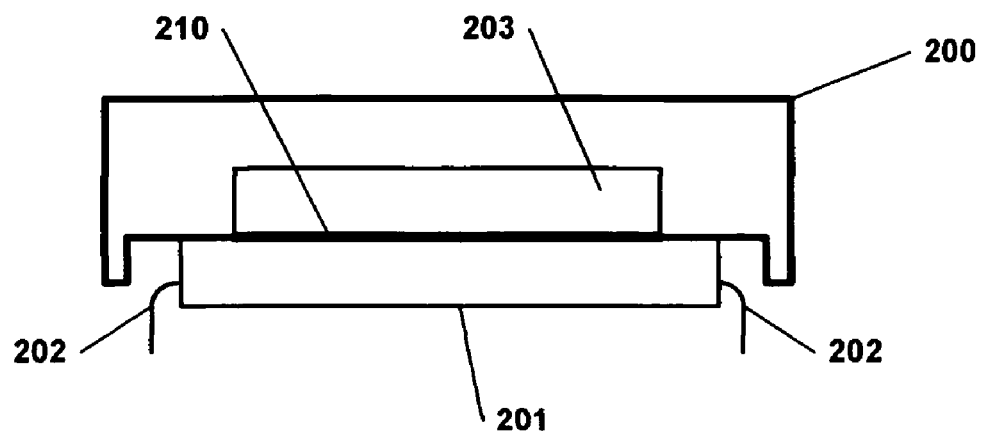
FIG. 2B is a side cross-sectional view of the mating, cover heat transfer unit with a heat generating component disposed therein.
Figure 2A:
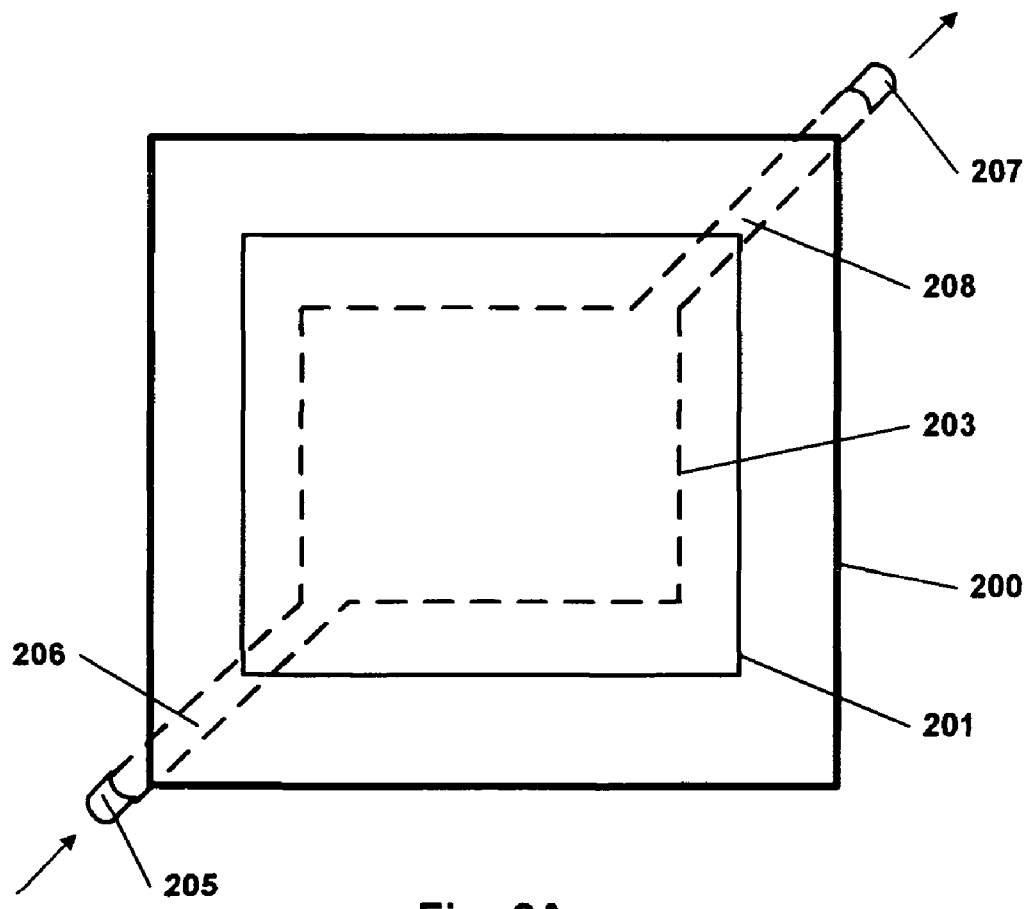
FIG. 2A is a top, cross-sectional view of a mating, cover heat transfer unit with a heat generating component disposed therein.

Referring now to FIGS. 2A and 2B, a cover heat transfer unit 200 for the connector heat transfer unit 100 is depicted which provides additional cooling of the heat generating component 201. In FIG. 2A, a top, cross-sectional view of the cover heat transfer unit 200 is depicted at the level of the surface of the heat generating component 201. The cover heat transfer unit 200 similarly includes a cavity 203. Entrances and exits for the coolant to and from the cavity 203 are provided by inlet 205 and inlet pathway 206 and by outlet 207 and outlet pathway 208, respectively. It will be appreciated and understood that other methods of receiving the coolant, directing the coolant through and out of the connector heat transfer unit may be utilized and are within the purview of the present invention.

FIG. 2B depicts a side, cross-sectional view of the cover heat transfer unit 200 and component 201. The electrical conductors or pins 202 of the component 201 are also shown. Cavity 203 has a surface 210 which is thermally coupled to the heat generating component 201.

The surface 210 may be comprised of any good heat conducting material, such as copper. This surface 210 is preferably coupled to the heat generating component 201 by means of a thermal paste having good thermal transfer characteristics. It should also be appreciated that there are a many other possibilities for thermally coupling component 201 to the surface 210 including, but not limited to, the application of mechanical force, such as a clamping motion, to create a positive force between component 201 and the surface 210 and thus improve thermal conductivity.

In operation, a cooled coolant is received at the inlet 205 and passes through the inlet pathway 206 to the cavity 203. While passing through the cavity 203, the coolant absorbs heat from the component 201 and becomes heated coolant. The heated coolant then passes through outlet pathway 208 to the outlet 207 where it will be directed to a heat exchange unit, cooled, and returned to the inlet 205 of the cover heat transfer unit 200.

Whenever possible, it is desirable to orient the cover heat transfer unit 200 so that the inlet 205 is situated below the outlet 207. This orientation allows the cooling system to take advantage of convective circulation of the coolant since heated coolant will naturally rise and cooled coolant will naturally drop. In this manner, the thermodynamics of the coolant can assist forced circulation, by a pump for example, and provide additional cooling of the heat generating components even after power is shut down to the electronic system.

A function of cover heat transfer unit 200 is to provide cooling to an additional surface of one or more heat generating components. When cover heat transfer unit 200 is used in conjunction with connector heat transfer unit 100 to form the housing and secure and cool a single heat generating component, for example, surface 210 is transferring heat from one side of the heat generating component to a coolant while surface 110 is transferring heat from an opposite side of the heat generating component to a coolant. Use of the cover heat transfer unit 200 then can provide dramatic increases in cooling power or capacity when combined with a connector heat transfer unit 100.

Figure 2C:
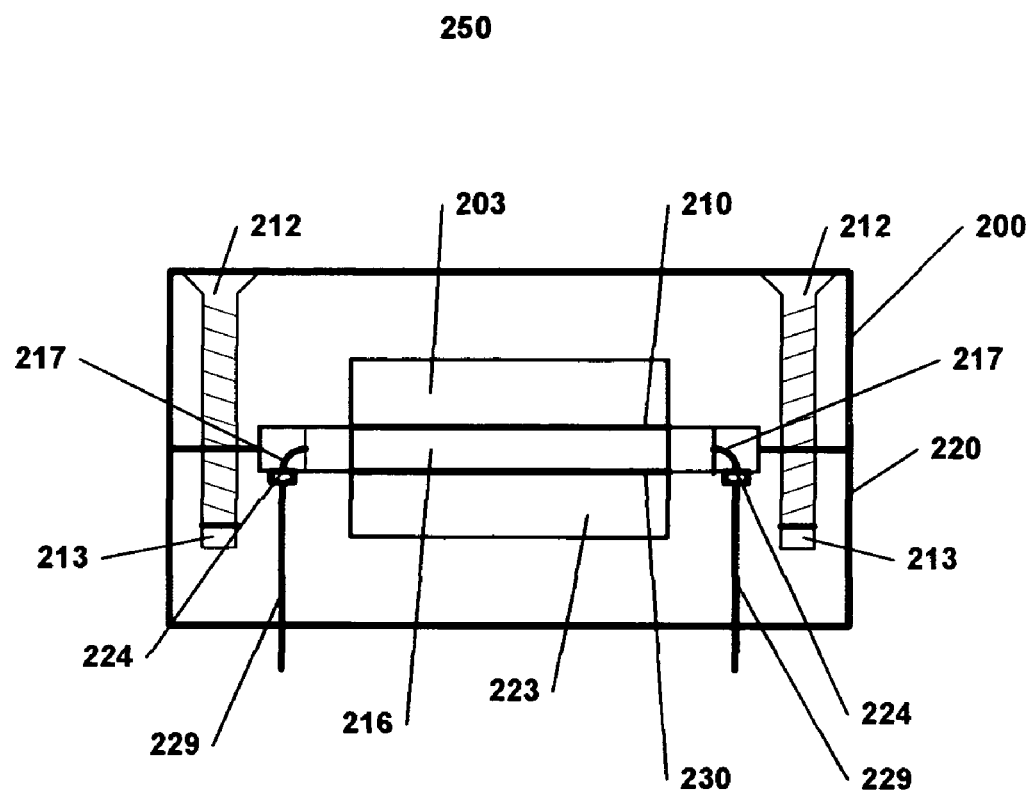

In FIG. 2C, such a housing or assembly 250 of a cover heat transfer unit 200 and a connector heat transfer unit 220 to cool a heat generating component 216 is depicted from a side, cross-sectional view. The connector heat transfer unit 220 includes a cavity 223; a surface 230 of the cavity 223 thermally coupled to the component 216; a plurality of receptacles or electrical contacts 224 to accept electrically the electrical conductors 217 of the component 216; and a plurality of connector heat transfer unit pins or electrical conductors 229, electrically connecting the receptacles 224 to the electronic system via, for example, by wave soldering to a motherboard, not shown, or otherwise electrically attached to the circuitry in an electronic system. All of the following embodiments of the invention can be deployed in an application where the connector heat transfer unit 220 is not mechanically attached to any type of motherboard.

The heat generating component 216 may be held in place within the assembly 250 and thermal coupling of the component to the surfaces 110 and 210 achieved by any number of methods. For example, one or more screws 212 threaded into one or more mating receptacles 213 may be utilized. Alternatively, or in addition, one or more spring clips, or any of a variety of mechanical fasteners to create a clamping force, not shown, from the connector heat transfer unit 220 to the cover 200 and/or adhesives may be utilized. In any case, it is preferable to apply a thermally conductive material to the coupling of surface 230 with the component 216 and to the coupling of surface 210 to the opposite side of the component 216 to insure maximum heat transfer. It should also be appreciated that the present invention includes other possibilities for thermally coupling contact surface 210 to the component 216 and/or contact surface 230 to component 216 including application of mechanical force to create pressure in a clamping motion to create a positive force between contact surfaces 210 and/or 230 and the component 216 so as to improve thermal conductivity.

In yet another alternative for coupling the surfaces 230 and 210 to the heat generating component 216, either one or both of the surfaces 230 and 210 may be open or partially open allowing the coolant to come into direct contact with the heat generating component 216 and thereby eliminating the thermal resistance of both the surfaces 230 and 210 and the thermal resistance of thermal paste or other thermal connection medium used. In this situation, for example, either or both of surfaces 230 and 210 could be in the form of a flange around the perimeter of the cavities 223 and 203, respectively. When the flanges are coupled and sealed to opposite sides of heat generating component 216, the cavities are sealed and coolant will come in direct contact with the component on opposite sides there of without leaks or spills.

It will also be understood that, for certain applications, it may be sufficient to provide cooling to only one surface of the heat generating components being cooled and still retain the benefits of a complete connector assembly, such as assembly 250. In such cases, it is preferable to have a housing comprising a cover heat transfer unit 200 and a connector with receptacles or electrical connections (to the electronic system) for the electrical conductors or pins 217 of one or more heat generating components 216 but without cavities or other means for cooling. It is understood that such a housing is within the purview of the present invention.

Figure 3:
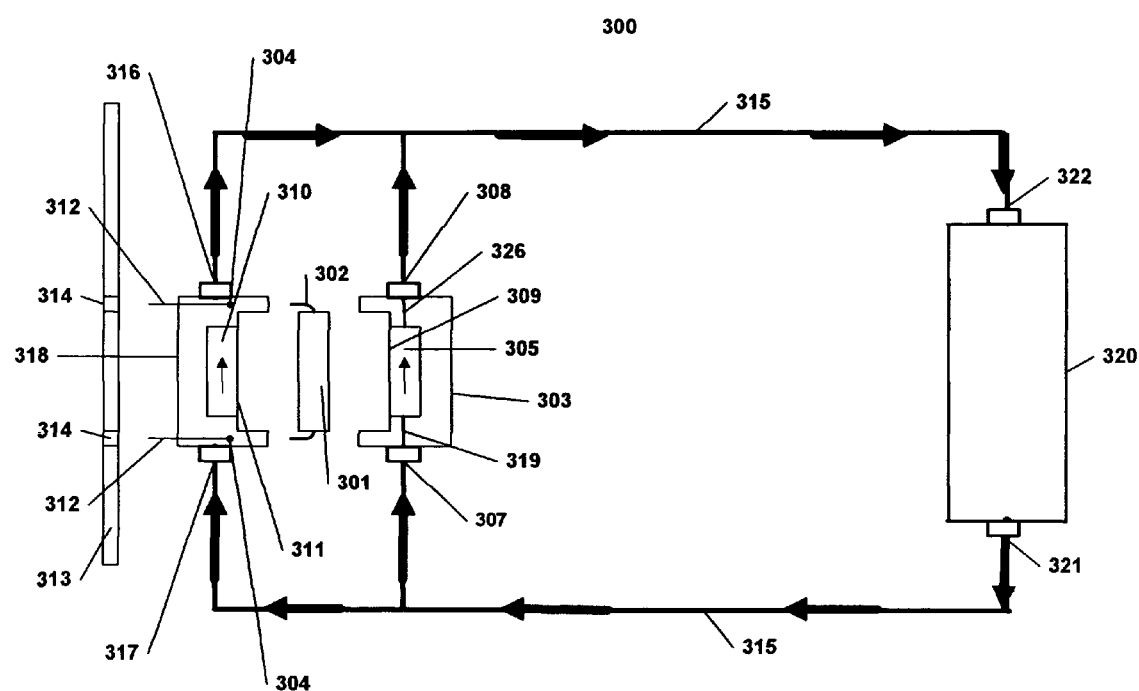
FIG. 3 depicts a cooling system with the connector heat transfer unit and cover heat transfer unit shown before assembly of these heat transfer units with the heat generating component and before insertion into a motherboard.

FIG. 3 represents a part schematic diagram of a complete cooling system 300 with a connector heat transfer unit 318 and a cover heat transfer unit 303 of the present invention. FIG. 3 also includes, for convenience, a part side, cross sectional view of a connector heat transfer unit 311, a heat generating component 301, the cover heat transfer unit 303, and motherboard to which the connector heat transfer unit is electrically connected and all of these are shown before assembly. It will be understood that a combination of one or more of the heat transfer units of the present invention and one or more other heat transfer units may be utilized in the cooling system 300.

The connector heat transfer unit 318 includes: a cavity 310 to be thermally coupled to the component 301 by contacting the surface of 311; a plurality of electrical connectors for receiving the electrical contacts 302 of component 301; a plurality of connector heat transfer unit electrical connectors for electrically coupling the electrical contacts 304 to the electronic system (which in some applications would be directly coupled to a motherboard 313 via electrical contacts 314); an inlet 317 for receiving cooled coolant from an outlet 321 of a heat exchange unit 320; and an outlet 316 for receiving heated coolant from the cavity 310 and directing it to an inlet 322 of the heat exchange unit 320. An inlet pathway for the coolant and an outlet pathway for the coolant are not shown.

The cover heat transfer unit 303 includes a cavity 305 to be thermally coupled to the component 301 at a surface 309, an inlet 307 for receiving cooled coolant from the outlet 321 of the heat exchange unit 320, an outlet 308 for receiving heated coolant from the cavity 305 and directing it to the inlet 322 of the heat exchange unit 320, an inlet pathway 319 for the coolant flow between the inlet 307 and the cavity 305, and an outlet pathway 326 for coolant flow from the cavity 305 to the outlet 308.

Heat exchanger 320 has an inlet 322 and an outlet 321 and is coupled to the heat transfer units 303 and 318 by means of a coolant transport system 315, such as conduits, for example. The directional arrows in FIG. 3 depict the direction of coolant flow throughout the cooling system 300.

The heat exchanger 320 receives heated coolant from outlets 308 and 316 of the heat transfer units 303 and 318 at its inlet 322. The heat exchanger 320 then dissipates heat from the coolant, creating cooled coolant which is directed to the outlet 321 and on to the inlets 307 and 317 of the heat transfer units 303 and 318 through the transport system 315 as shown by the directional arrows. The heat transfer units 303 and 318 absorb heat from the heat generating component 301 into the coolant, creating heated coolant, and directs the heated coolant back to the heat exchanger 320, through the outlets 308 and 316 and the coolant transport system 315.

It will be understood that any number and type of heat exchange units may be employed with the heat transfer units of the present invention including heat exchange units with and without reservoirs; with or without a pump; and with and without fans or other air flow devices. It should also be appreciated that a remotely mounted or external heat exchange unit may also be used. Any of the of the heat exchange unit embodiments may be used to cool one or more of the heat transfer units, such as heat transfer units 303 and 318, connected by coolant pathways in series or parallel or any combination thereof.

Any number of coolants, liquid or gas, may be used with the present invention such as, for example, a propylene-glycol based coolant. The scope of this invention also includes refrigerated cooling systems of all types including, but not limited to, systems utilizing both conventional Freon and chilled coolant systems. This refrigerated cooling embodiment would include, for example, a heat exchange unit including a heat exchanger, a compressor, and an expansion valve or other flow control device, either in a single piece of equipment or as separate components, in conjunction with any of the connector heat transfer units or cover heat transfer units described herein to cool the heat generating components thermally coupled to the heat transfer units.

In FIG. 3, the inlets 307 and 317 of the heat transfer units are shown disposed below the outlets 308 and 316. Similarly, the inlet 322 of the heat exchange unit 320 is shown above the outlet 321. Disposition of inlets and outlets in this manner, when possible, maximizes convective circulation of the coolant through the system to enhance the forced circulation of the coolant during normal operation with power and to provide cooling through convective circulation after power shut down to the electronic system.

It will be appreciated that most heat generating components, such as processors, are currently supplied with a heat spreader coupled to the surface of the component opposite to the surface of the component closest to the point of electrical connection to the electronic system or motherboard. In FIG. 3, for example, the heat spreader would be coupled to the surface of component 301 closest to the cover heat transfer unit 303. These heat spreaders are used to spread the heat from the "hot spots" of the component 301 over the entire surface of the component so that a heat sink or heat pipe can be more effective in dissipating heat from the component. The present invention also includes, heat generating components such as component 301, with one or more thermal spreaders coupled to the surface of the component closest to the point of electrical connection to the electronic system (e.g. the bottom surface) and heat generating components with one or more heat spreaders couple to both the bottom surface of the component and the opposite or top surface. It will be further understood that these heat spreaders may be coupled to the exterior surface of the heat generating component, or within the packaging of the component or embedded in the substrate of the component or any combination of the above.

It will be understood that connector heat transfer unit and the cover heat transfer unit of the present invention may be constructed to receive and retain a plurality of heat generating components. The cavities within each for coolant flow and absorption of heat from the heat generating components may be configured in several ways. For example, each may contain several cavities disposed so as to align with the surfaces of the heat generating components and interconnected by coolant pathways. Each may contain just a single cavity which is thermally coupled to a side of each of the heat generating components. However, depending on the electrical conductor or pin configurations of the heat generating components, the single cavity approach may not be feasible in all circumstances for the connector heat transfer units because of the electrical conductors, such as the receptacles and connector heat transfer unit pins, for electrically connecting the electrical conductors of the heat generating components to the electronic system. The single cavity method is preferable because it is easier to maintain a more uniform coolant flow through the cavity.

It may also be preferable in such circumstances to reverse the directions of coolant flow between the connector heat transfer unit and the cover heat transfer unit so that the heat generating component which is cooled last in the sequence by the connector heat transfer unit is cooled first in the sequence by the cover heat transfer unit. It is to be understood, however, that any combination of directional flow that best suites a particular application is within the scope of this invention.

Figure 4A:
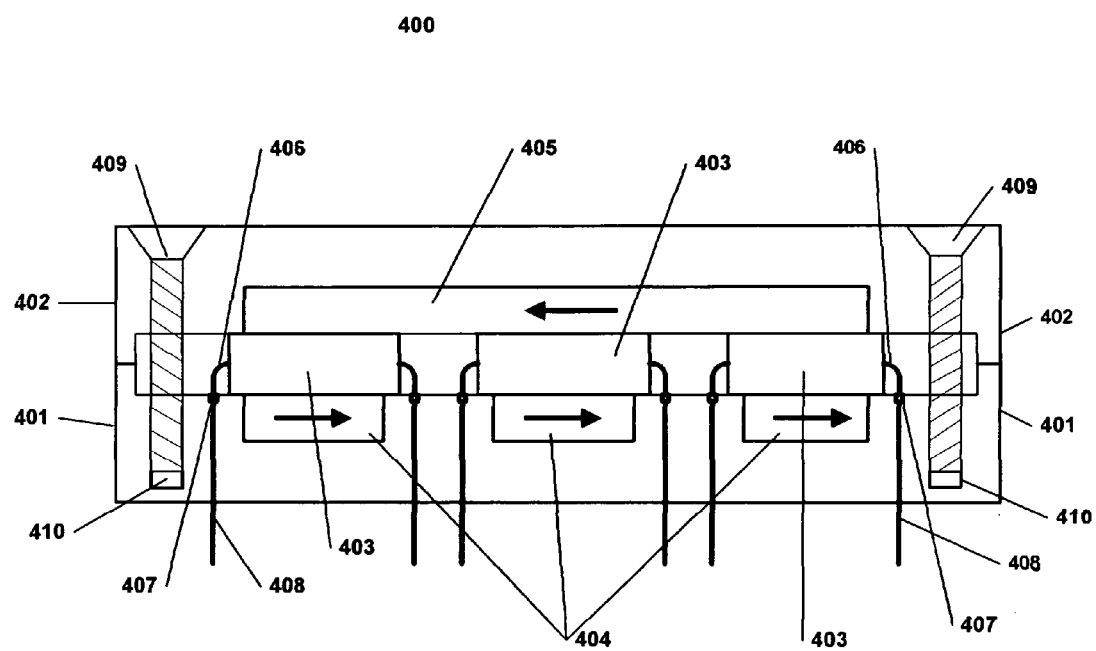
FIG. 4A depicts a side, cross-sectional view of a housing including both a connector heat transfer unit and a cover heat transfer unit with three heat generating components disposed there in and with the heat generating components being cooled in series and in reverse sequence between the connector heat transfer unit and the cover heat transfer unit.
Figure 4B:
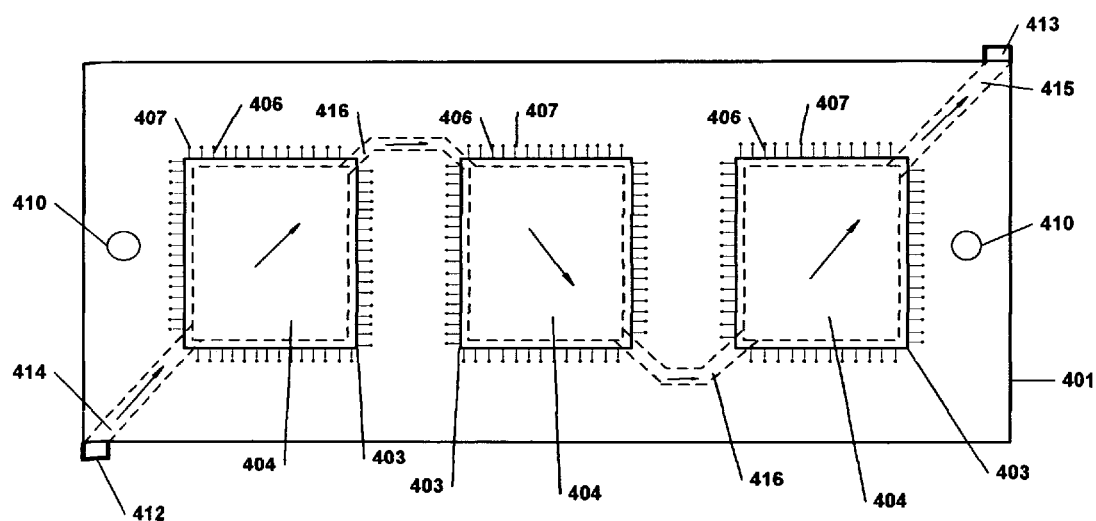
FIG. 4B is a top, cross sectional view of the connector heat transfer unit and the heat generating components of FIG. 4A.

FIGS. 4A and 4B are a depiction of such a housing 400 where the cover heat transfer unit 402 has a single cavity 405 there through and the connector heat transfer unit 401 has separate cavities 404 interconnected by coolant pathways 416 and the coolant flow is reversed between the cover heat transfer unit and the connector heat transfer unit as shown by the coolant flow directional arrows. It is to be understood, however, that any combination of directional flow that best suites a particular application is within the scope of this invention.

FIG. 4A is a cross-sectional view of the housing 400. The connector heat transfer unit 401 is depicted with three cavities 404 with each cavity 404 thermally coupled to one of three heat generating components 403, a plurality of electrical conductors, such as receptacles 406 and pins 408, for electrically receiving the electrical contacts 406 of the three heat generating components 403 and electrically connecting them to the electronic system via a motherboard (not shown), and a plurality of threaded receptacles 410 for receiving machine screws 409 through the cover heat transfer unit 402 and thereby securing the assembly 400. Other mechanical means may be utilized to couple cover heat transfer unit 402 to connector heat transfer unit 401 as best suited for each application of this assembly 400. All of the following embodiments of the invention can be deployed in an application where the connector heat transfer unit is not mechanically attached to any type of motherboard.

The cover heat transfer unit 402 includes a single cavity 405 thermally connected to a different surface of each of the three heat generating components 403. The cover heat transfer unit 402 is physically secured to the connector heat transfer unit by a plurality of machine screws which pass through the cover heat transfer unit and are secured into the threaded receptacles 410 in the connector heat transfer unit 401. Other mechanical means may be utilized to couple cover heat transfer unit 402 to connector heat transfer unit 401 as best suited for each application of this assembly 400.

FIG. 4B is a top, cross sectional view of the heat generating components and the connector heat transfer unit taken at the component electrical conductor or pin level height. The connector heat transfer unit is depicted showing the cavities 404 interconnected by coolant pathways 416. Additionally, an inlet 412, an inlet pathway 414, an outlet 413 and an outlet pathway are depicted.

In operation, cooled coolant is received at the inlet 412 of the connector heat transfer unit 401 and directed to the first cavity 404 via inlet pathway 414. The coolant passes through the first cavity and on to the second cavity 404 via a pathway 416. The coolant passes on to the third cavity 404 via another pathway 416 and finally out of the connector heat transfer unit via outlet pathway 415 and outlet 413. Heat is transferred to the coolant from the respective heat generating components 403 and the coolant passes through the cavities 404, the coolant becoming more heated as it flows through each successive cavity 404. The cavities 404 may be arranged in such a manner via conduits or coolant pathways as to create coolant flow in series, parallel, or a combination there of as best suited for individual applications.

The cavities 404 may be thermally coupled to the heat generating components 403 by a contact surface of a thermal conducting material such as copper. Alternatively, the contact surface of the cavities may open or partially open and the cavities thermally coupled and sealed to the heat generating components 403 around the perimeter of the contact surface of each cavity 404. This latter method allows the coolant to come into direct contact with the heat generating components 403 thereby eliminating the thermal resistance of the contact surface of each cavity 404 and the thermal resistance of a thermal paste or other thermal connection medium used.

In operation, cooled coolant is received at an inlet, not shown, of the cover heat transfer unit 402 and directed through the cavity 405 and out of the cavity through an outlet, not shown. Heat is transferred to the coolant from the respective heat generating components 403 and the coolant passes through the cavity 405, the coolant becoming more heated as it flows further through the cavity 405.

The cavity 405 may be thermally coupled to the heat generating components 403 by a contact surface such as a piece of a thermal conducting material like copper. The contact surface may be a single piece of thermal conducting material, for example, that extends the entire length of the cavity 405 or it may be a plurality of pieces of thermally conductive material, each thermally coupled to one or more heat generating components 403. Alternatively, the contact surface of the cavity may consist of three openings thermally coupled and sealed to a separate heat generating component 403. This latter method allows the coolant to come into direct contact with the heat generating components 403 thereby eliminating the thermal resistance of the contact surface of the cavity 405 and the thermal resistance of a thermal paste or other thermal connection medium used.

Both of the above methods result in a serial connection of the coolant between cavities in the connector heat transfer unit 401 and/or the cover heat transfer unit 402. This means that the coolant is being heated as it passes by each component and, the coolant already being substantially heated by the point it passes by the last component in the sequence. In such situations when, for example, more than three heat generating components are to be secured, electrically connected and cooled by a housing comprising a connector heat transfer unit, or a connector heat transfer and a cover heat transfer unit, or a cover heat transfer unit and a connector without cooling capability, it is preferable to have the coolant pass by each component in a parallel fashion with an inlet and/or inlet pathway and an outlet and/or outlet pathway to each cavity. The cavities may be arranged in such a manner via conduits or coolant pathways as to create coolant flow in series, parallel, or a combination thereof as best suited for individual applications.

Figure 5:
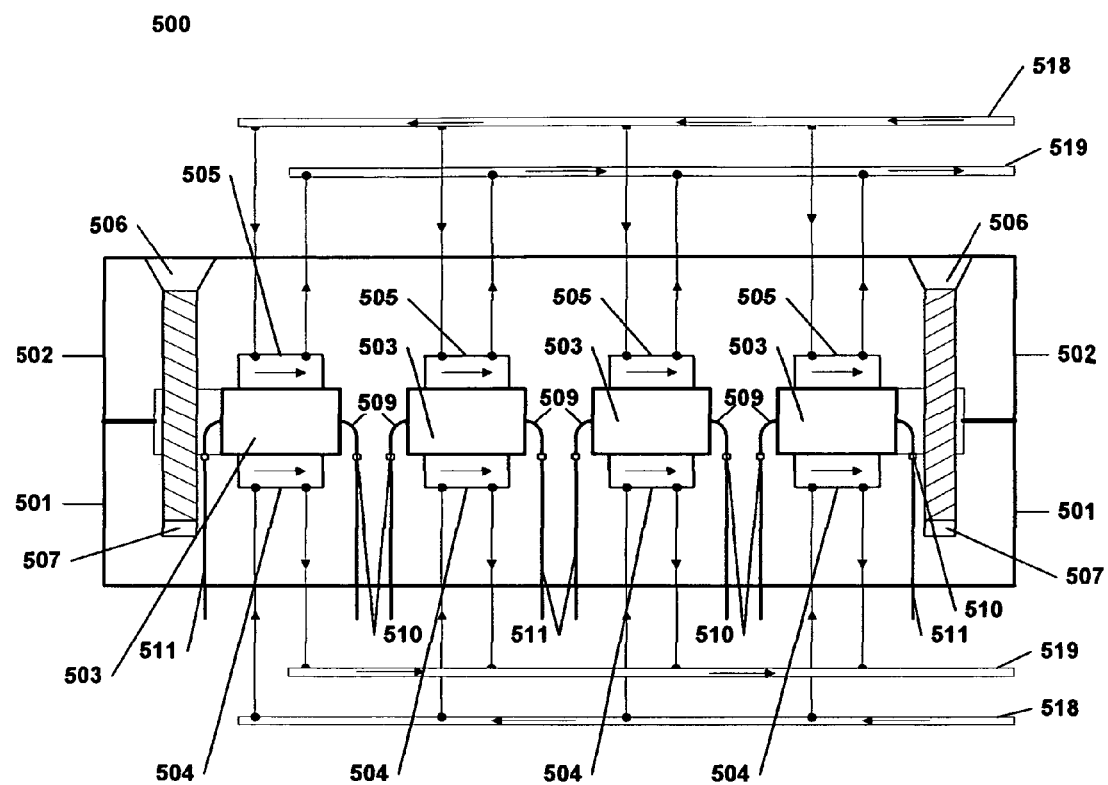
FIG. 5 depicts a side, cross-sectional view of a housing including both a connector heat transfer unit and a cover heat transfer unit with four heat generating components disposed there in and with the heat generating components being cooled in parallel.

FIG. 5 is a part side cross sectional view of a housing 500 and part coolant flow schematic depicting one example of this parallel flow of coolant. In FIG. 5, four heat generating components 503 are secured and cooled by the assembly 500. However, it will be understood that four heat generating components 503 is an example, and that any plurality of heat generating components 503 may be secured and/or cooled. The cavities may be arranged in such a manner via conduits or coolant pathways as to create coolant flow in series, parallel, or a combination there of as best suited for individual applications.

FIG. 5 depicts a connector heat transfer unit 501 having four cavities 504 each thermally coupled to a component 503; a plurality of electrical conductors 510 for electrically receiving the electrical contacts of 509 of the components 503; a plurality of connector heat transfer unit electrical contacts 511 for electrically connecting the receptacles 510 to the electronic system via, for example a motherboard; and a plurality of threaded receptacles 507 for receiving machine screws 506 and securing the assembly 500 together. Other mechanical means may be utilized to couple cover heat transfer unit 502 mechanically to connector heat transfer unit 501 as best suited for each application of the housing 500. Such methods of securing the assembly 500 would be obvious to one skilled in the art. All of the following embodiments of the invention can be deployed in an application where the connector heat transfer unit 501 is attached to a motherboard or not mechanically attached to any type of motherboard or circuit board.

FIG. 5 also depicts a cover heat transfer unit 502 having four cavities 505, each thermally coupled to a component 503, and a plurality of machine screws 506 passing there through and into threaded receptacles 507. Other mechanical means may be utilized to couple cover heat transfer unit 502 mechanically to connector heat transfer unit 501 as best suited for each application of this housing 500. Such methods of securing the assembly 500 would be obvious to one skilled in the art.

FIG. 5 also schematically depicts a coolant transport system. Transport system 518 provides cooled coolant to an inlet, not shown, for each cavity 504 and each cavity 505. Similarly, transport 519 receives heated coolant from an outlet, not shown, of each cavity 504 and each cavity 505 to direct the heated coolant to a heat exchanger for cooling and return to the assembly 500 via transport 518.

All or some of the cavities 504 and 505 may have contact surfaces with the heat generating components of a heat conducting material such as copper or openings that allow for direct contact of the coolant with the component 503 surfaces. Additionally, the housing 500 should be disposed, whenever feasible, so that the inlets to the cavities are below the outlets from the cavities to enhance convective flow of the coolant through the cooling system.

Thus, the present invention has been described herein with reference to particular embodiments for particular applications. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A cooling system for cooling heat-generating components in an electronic system having one or more connector heat transfer units, the connector heat transfer unit comprising:

a housing connected to the electronic system wherein one or more discrete heat-generating components can be inserted into or removed from the housing, the heat-generating components being electrically coupled to the electronic system when inserted into the housing, the housing having one or more first sealed cavities thermally coupled to a first surface of the one or more heat-generating components, wherein a coolant flowing through the first sealed cavities absorbs heat from first surfaces of the heat-generating components creating heated coolant and without the coolant coming into direct contact with the heat generating components;

one or more inlets for receiving coolant and directing the coolant through the cavities; and one or more outlets for receiving heated coolant from the cavities and directing the heated coolant out of the connector heat transfer unit.

2. The cooling system as set forth in claim 1 further comprising:

one or more second sealed cavities thermally coupled to a second surface of the heat-generating components, the second surface being oppositely disposed on the heat-generating components to the first surface, wherein a coolant flowing through the second cavities absorbs heat from the second surface of the heat-generating components creating heated coolant and without the coolant coming into direct contact with the heat generating components.

3. The cooling system of claim 1 wherein the housing further comprises means for receiving electrical contact means of the one or more heat-generating components and electrically coupling the electrical contact means of the heat-generating components to the electronic system and wherein the portion of the housing adjacent to the means for receiving electrical contact means is comprised of thermally conductive material for transferring heat from the electrical contact means of the heat-generating components to the first cavities.

4. The cooling system as set forth in claim 1 further comprising:

a heat exchange unit for receiving heated coolant from the connector heat transfer units, cooling the coolant by dissipating heat from the coolant and generating cooled coolant for transporting to the heat transfer units; and means for transporting heated coolant from the connector heat transfer units to the heat exchange unit and transporting cooled coolant from the heat exchange unit to the connector heat transfer units.

5. The cooling system as set forth in claim 1 wherein one or more inlets are disposed below one or more outlets to enhance convective circulation of the coolant.

6. The cooling system of claim 1 wherein the portion of the housing thermally coupling one or more of the first cavities to the first surface of one or more heat generating components is comprised of thermally conductive material for transferring heat from the first surface of the one or more heat-generating components to the first cavities.

7. The cooling system of claim 2 wherein the portion of the housing thermally coupling one or more of the second cavities to the second surface of one or more heat generating components is comprised of thermally conductive material for transferring heat from the second surface of the one or more heat-generating components to the second cavities.

8. A motherboard having the cooling system of claim 1.

9. An optical device having the cooling system of claim 1.

10. A system having one or more processors and having the cooling system of claim 1.

11. A motherboard having the cooling system of claim 2.

12. An optical device having the cooling system of claim 2.

13. A system having one or more processors and having the cooling system of claim 2.

14. A telecommunications system having the cooling system of claim 1. system of claim 1.

15. A method of cooling and electrically connecting heat-generating components in an electronic system, the method comprising the steps of:
    inserting one or more heat-generating components into a housing, the housing having means for electrically coupling electrical conductors of the heat-generating components to the electronic system;
    thermally coupling one or more sealed first cavities in the housing to a first surface of the one or more of the heat-generating components;
    circulating a coolant through the first cavities disposed in the housing; and
    cooling one or more of the heat-generating components by transferring heat from the first surface of the heat-generating components to the coolant flowing through the cavities and creating heated coolant without the coolant coming into direct contact with the heat generating components.

16. The method of cooling and electrically connecting as set forth in claim 15 further comprising the steps of:
    thermally coupling one or more sealed second cavities in the housing to a second surface of the heat-generating components. the second surface being oppositely disposed on the heat-generating components to the first surface;
    circulating a coolant through the second cavities; and
    cooling the heat-generating components by transferring heat from the second surface of the heat-generating components to the coolant flowing through the second cavities and creating heated coolant without the coolant coming into direct contact with the heat generating components.

17. The method of cooling and electrically connecting as set forth in claim 15, wherein the housing has one or more inlets for receiving coolant and one or more outlets for receiving heated coolant from cavities, the method further comprising the step of:
    positioning inlets below outlets to enhance convective circulation.

18. The method of cooling and electrically connecting as set forth in claim 15, the method further comprising the steps of:
    transporting the heated coolant from the housing to a heat exchange unit;
    cooling the heated coolant in the heat exchange unit by dissipating heat from the coolant and creating cooled coolant; and
    transporting the cooled coolant from the heat exchange unit to the housing.

19. The method of cooling and electrically connecting as set forth in claim 16, the method further comprising the steps of:
    transporting the heated coolant from the housing to a heat exchange unit;
    cooling the heated coolant in the heat exchange unit by dissipating heat from the coolant and creating cooled coolant; and
    transporting the cooled coolant from the heat exchange unit to the housing.

20. A method of cooling one or more heat generating components comprising the steps of:
    utilizing a coolant to absorb heat from a first surface of the one or more heat-generating components;
    utilizing a coolant to absorb heat from a second surface of the one or more heat generating components; and
    wherein the first surface of the heat-generating components are cooled in series and wherein the second surface of the heat generating components are cooled in series but in a different order than the first surface of the heat-generating components.

* * * * *